United States Patent
Kim et al.

(10) Patent No.: US 12,268,104 B2
(45) Date of Patent: Apr. 1, 2025

(54) COMPOSITION FOR MEMORY CELL CONTAINING CHALCOGEN COMPOUND, STRUCTURE THEREOF, METHOD FOR MANUFACTURING SAME, AND METHOD FOR OPERATING SAME

(71) Applicant: IHW Inc., Yongin-si (KR)

(72) Inventors: Jun-sung Kim, Seongnam-si (KR); Seung-hwan Lee, Ann Arbor, MI (US); Sang-hoon Yoon, Seongnam-si (KR)

(73) Assignee: IHW INC., Yongin-si (KR)

( * ) Notice: Subject to any disclaimer, the term of this patent is extended or adjusted under 35 U.S.C. 154(b) by 117 days.

(21) Appl. No.: 17/774,191

(22) PCT Filed: Nov. 13, 2020

(86) PCT No.: PCT/KR2020/015992
§ 371 (c)(1),
(2) Date: May 4, 2022

(87) PCT Pub. No.: WO2021/096288
PCT Pub. Date: May 20, 2021

(65) Prior Publication Data
US 2022/0367808 A1   Nov. 17, 2022

Related U.S. Application Data

(60) Provisional application No. 62/935,675, filed on Nov. 15, 2019.

(51) Int. Cl.
*H10N 70/00* (2023.01)
*G11C 13/00* (2006.01)
(Continued)

(52) U.S. Cl.
CPC ..... *H10N 70/8825* (2023.02); *G11C 13/0004* (2013.01); *G11C 13/0069* (2013.01);
(Continued)

(58) Field of Classification Search
CPC ............ H10N 70/8825; H10N 70/066; H10N 70/231; H10N 70/841; H10N 70/063;
(Continued)

(56) References Cited

U.S. PATENT DOCUMENTS 8,120,951 B2 * 2/2012 Mouli ................ G11C 13/0014
365/163
2006/0103026 A1   5/2006 Campbell
(Continued)

FOREIGN PATENT DOCUMENTS

JP    2014-225314    12/2014
KR    20120137862    12/2012
(Continued)

*Primary Examiner* — Donald H B Braswell
(74) *Attorney, Agent, or Firm* — LEX IP MEISTER, PLLC

(57) ABSTRACT

An object of the present invention is to provide a composition, a memory structure suitable for the composition, a manufacturing method, and an operating method for stable operation in a memory element including a chalcogen compound. In order to achieve the object, in a memory array with a cross-point structure including a first electrode line and a second electrode line intersecting each other, and a selective memory element disposed at each intersection of the first electrode line and the second electrode line and being a chalcogen compound, the present invention may provide the memory array with a cross-point structure including the first electrode line formed on a substrate, a first functional electrode formed between the first electrode line and the selective memory element, and a second functional electrode formed between the second electrode line and the selective memory element, wherein the first functional electrode is formed as a line along the first electrode line.

4 Claims, 9 Drawing Sheets

(51) Int. Cl.
    *H10B 63/00*         (2023.01)
    *H10B 63/10*         (2023.01)
    *H10N 70/20*         (2023.01)

(52) U.S. Cl.
    CPC ............ *H10B 63/10* (2023.02); *H10B 63/80* (2023.02); *H10N 70/066* (2023.02); *H10N 70/231* (2023.02); *H10N 70/841* (2023.02); *G11C 2013/0083* (2013.01)

(58) Field of Classification Search
    CPC .... H10N 70/20; H10N 70/826; H10N 70/882; H10N 70/011; H10N 70/821; G11C 13/0004; G11C 13/0069; G11C 2013/0083; G11C 13/004; G11C 13/0097; H10B 63/80; H10B 63/20
    See application file for complete search history.

(56) References Cited

U.S. PATENT DOCUMENTS

| | | | |
|---|---|---|---|
| 2016/0217855 A1* | 7/2016 | Bertin | G11C 13/0004 |
| 2017/0309331 A1* | 10/2017 | Tortorelli | G11C 13/004 |
| 2018/0019392 A1 | 1/2018 | Lee et al. | |
| 2019/0035851 A1 | 1/2019 | Tortorelli | |
| 2019/0198096 A1* | 6/2019 | Mirichigni | G11C 16/30 |
| 2020/0075854 A1* | 3/2020 | Park | H10N 70/826 |
| 2021/0020235 A1* | 1/2021 | Chou | G11C 13/0026 |
| 2021/0057026 A1* | 2/2021 | Sarpatwari | G11C 5/144 |

FOREIGN PATENT DOCUMENTS

| | | |
|---|---|---|
| KR | 20140012185 | 1/2014 |
| KR | 20190057058 | 5/2019 |

* cited by examiner

[FIG.1]
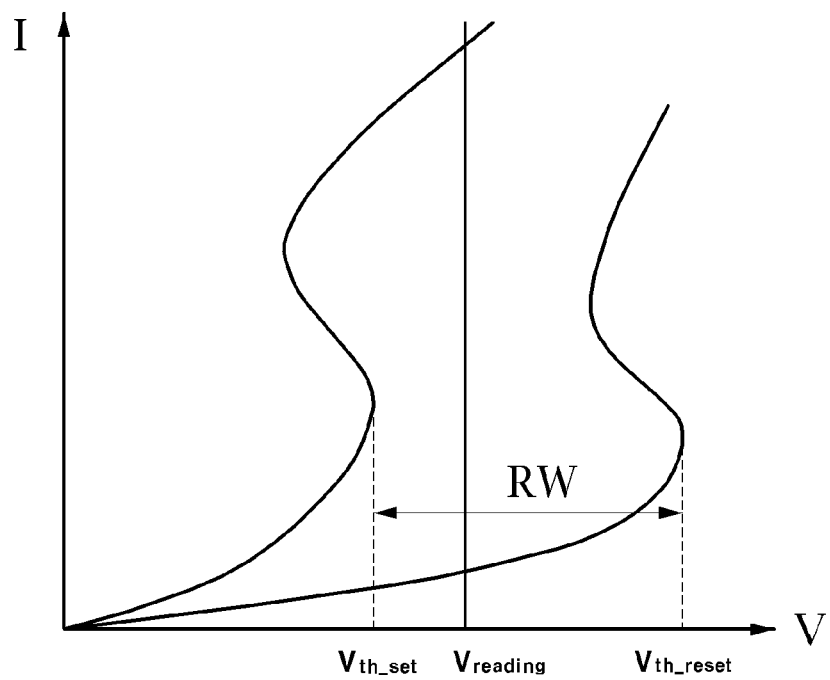
[FIG.2]
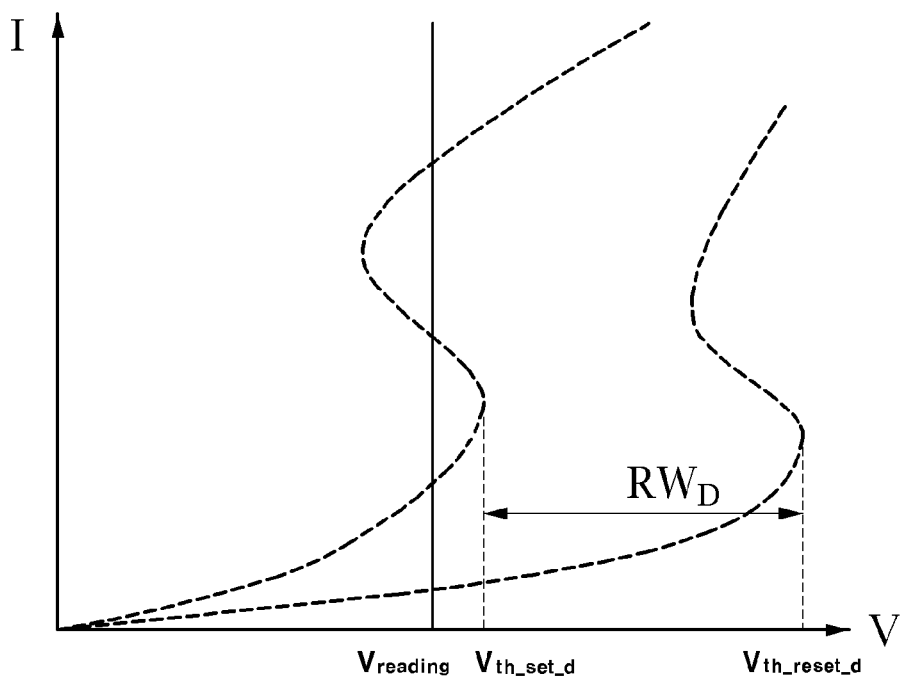

[FIG.3]
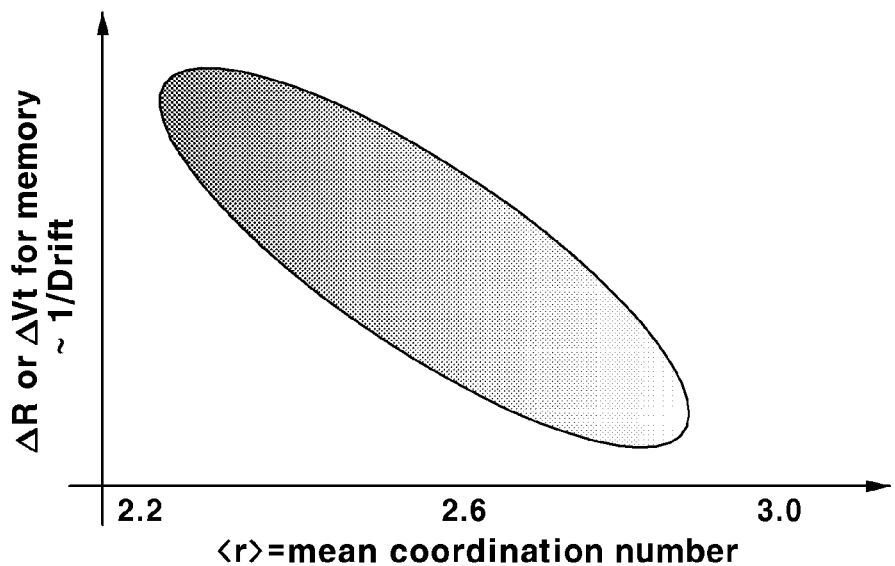
[FIG.4]
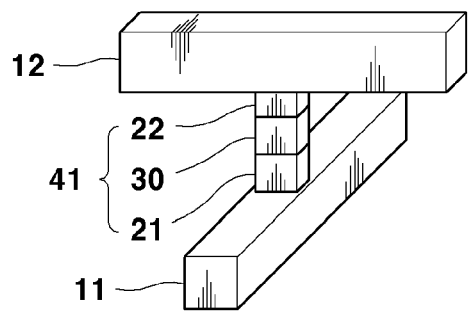
[FIG.5]
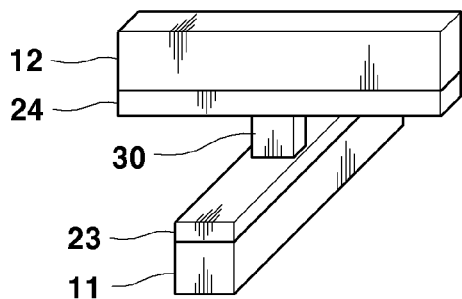

[FIG.6]
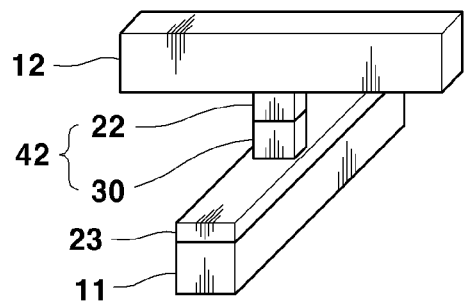
[FIG.7]
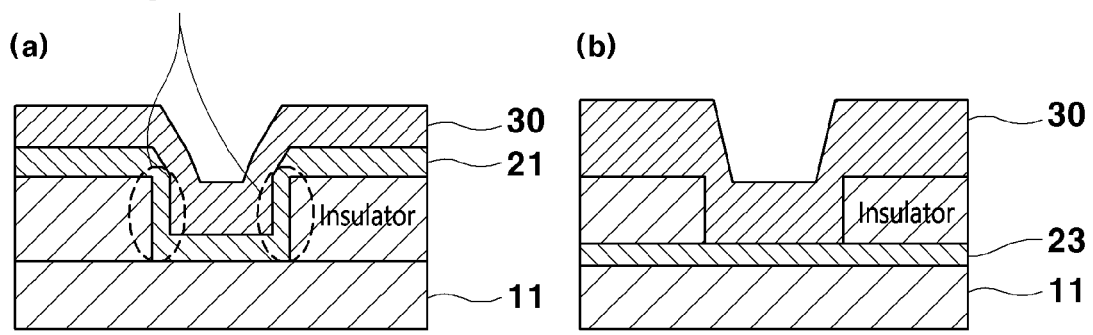

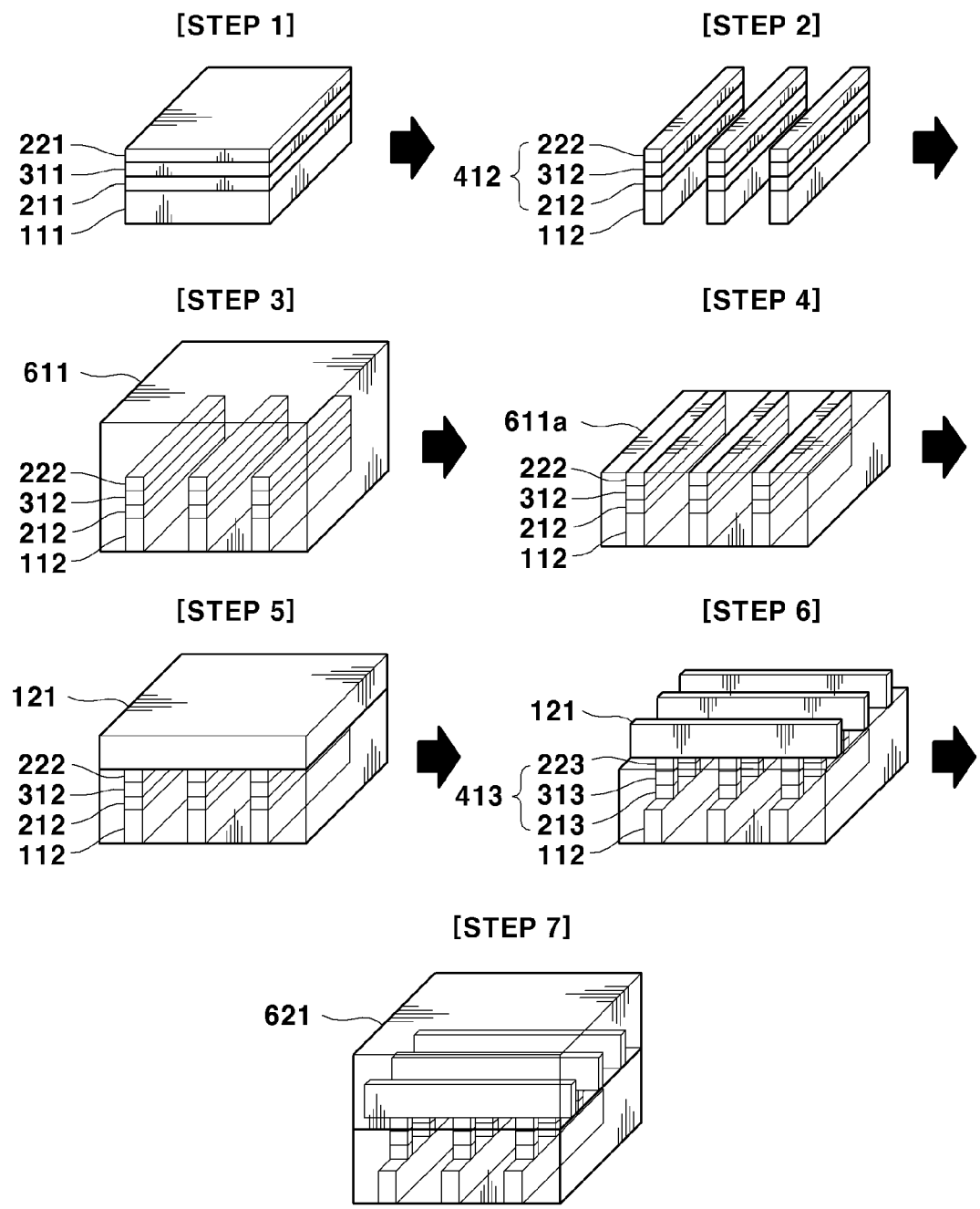

[FIG.9]
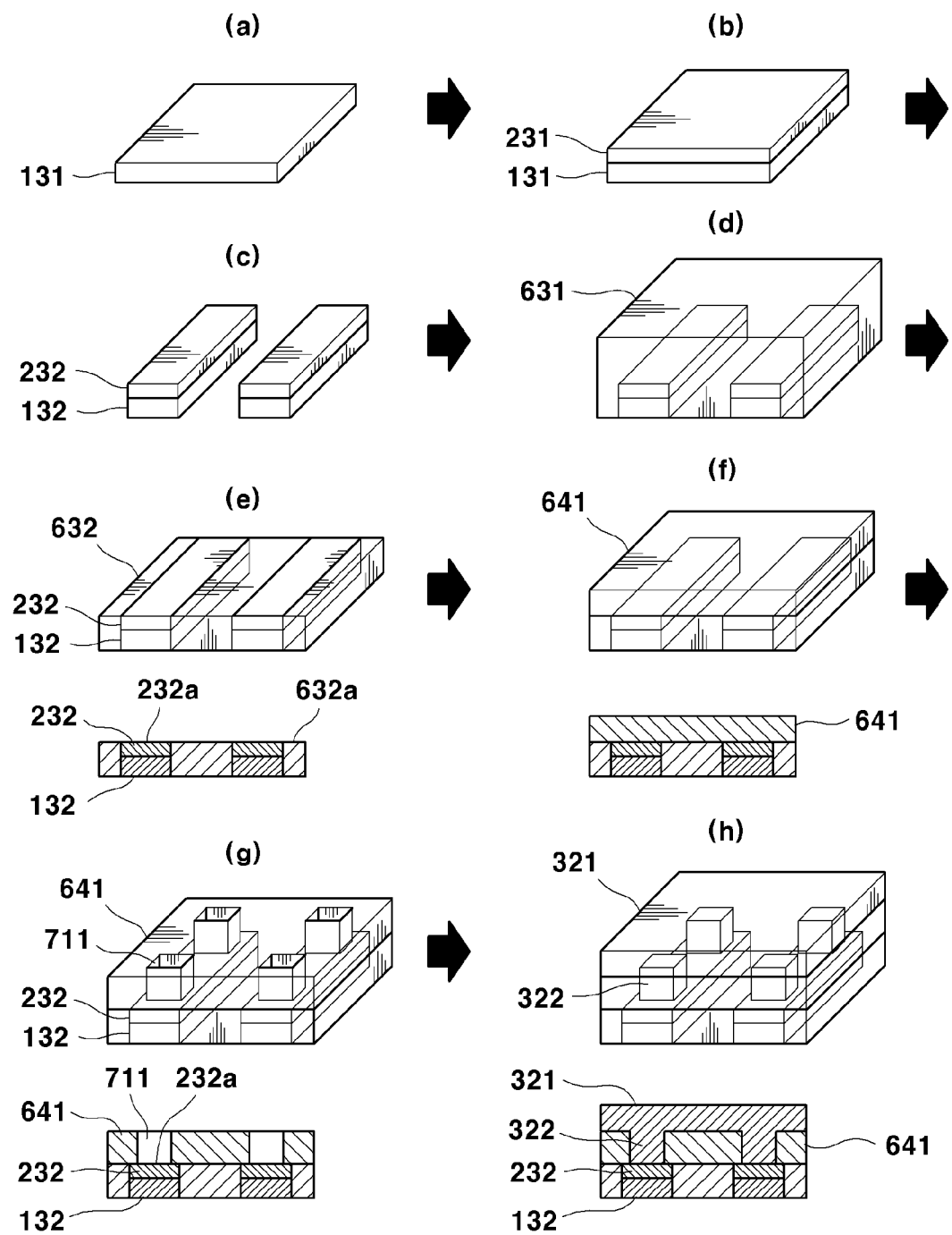

[FIG.10]
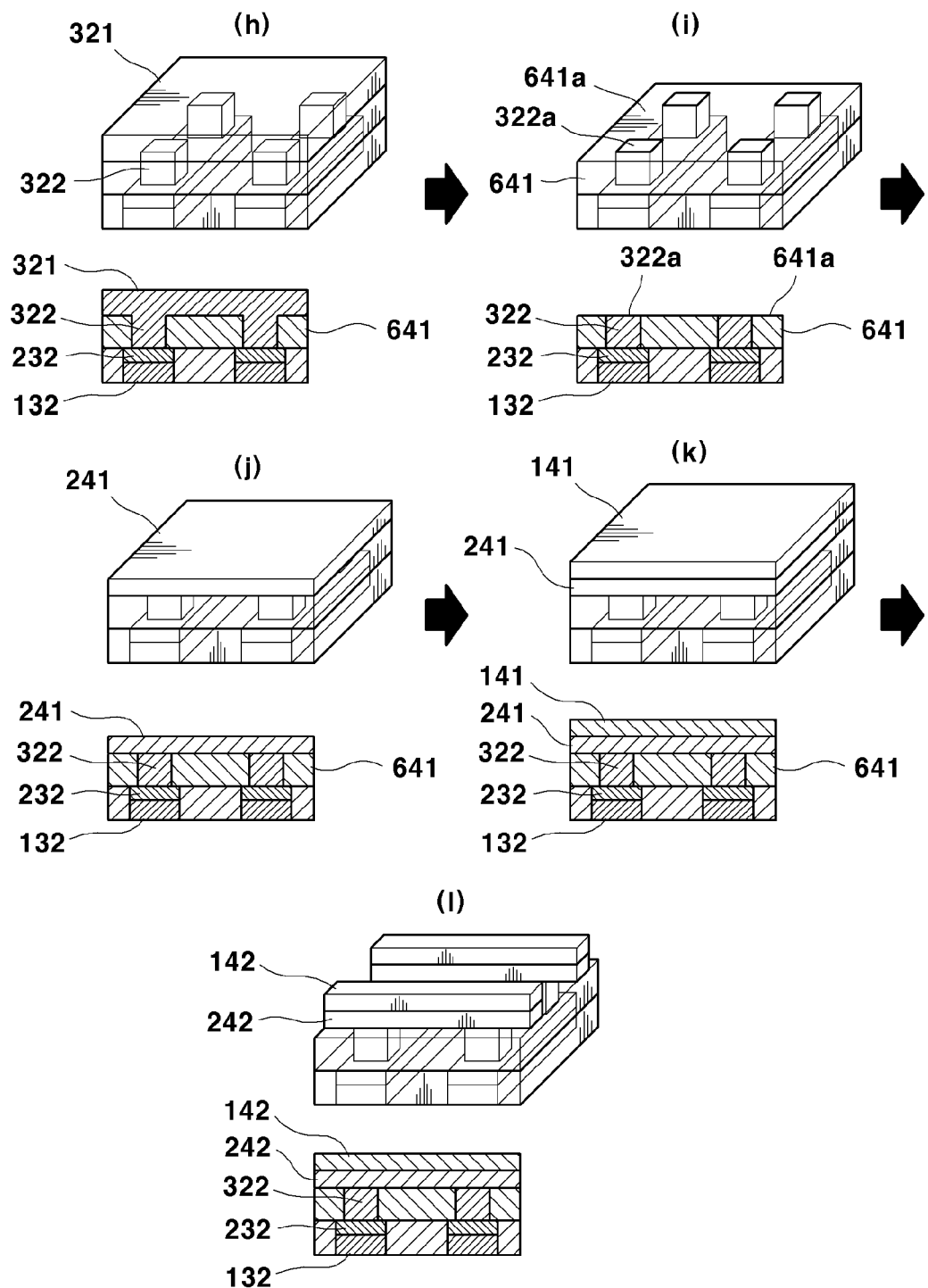

[FIG.11]
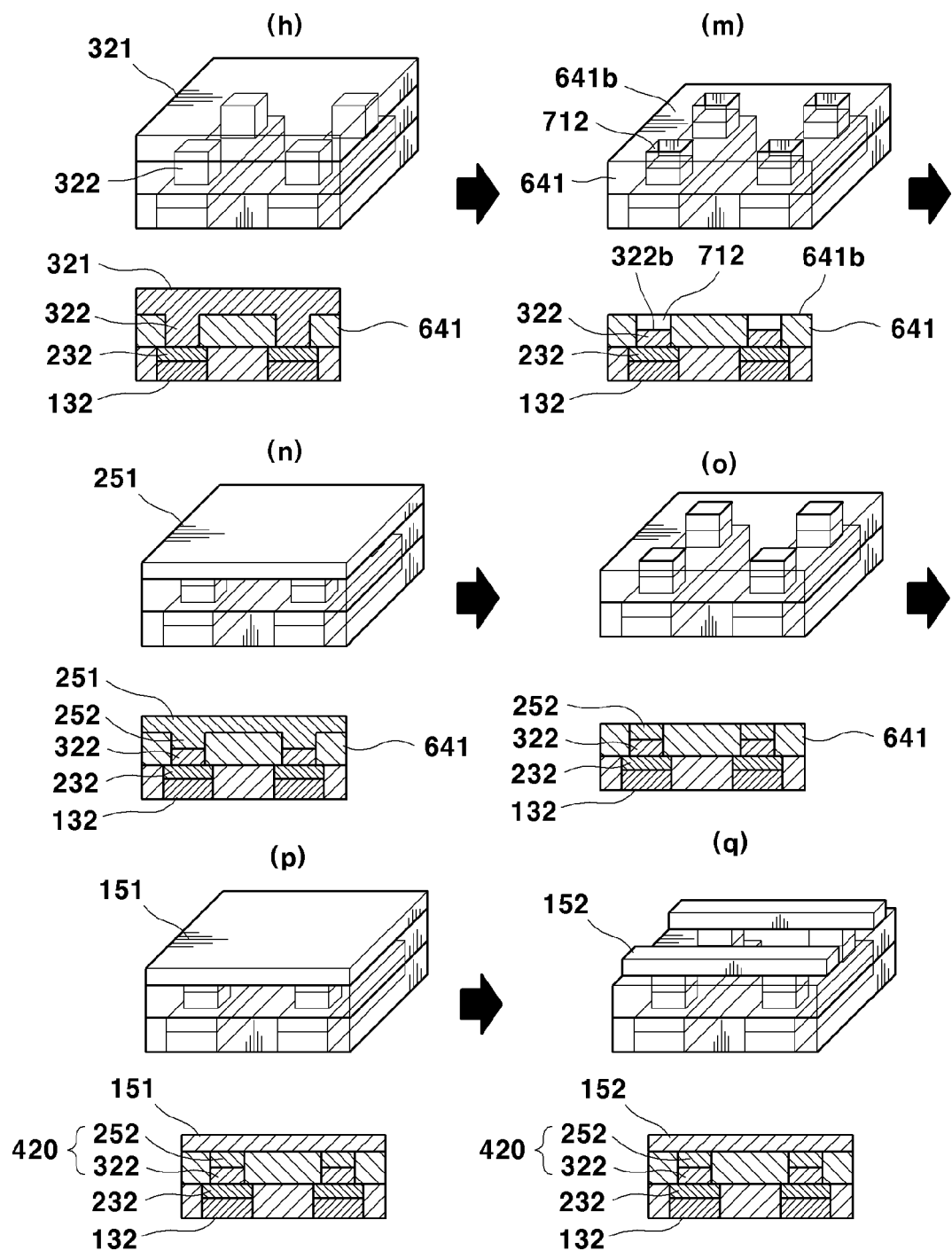

[FIG.12]
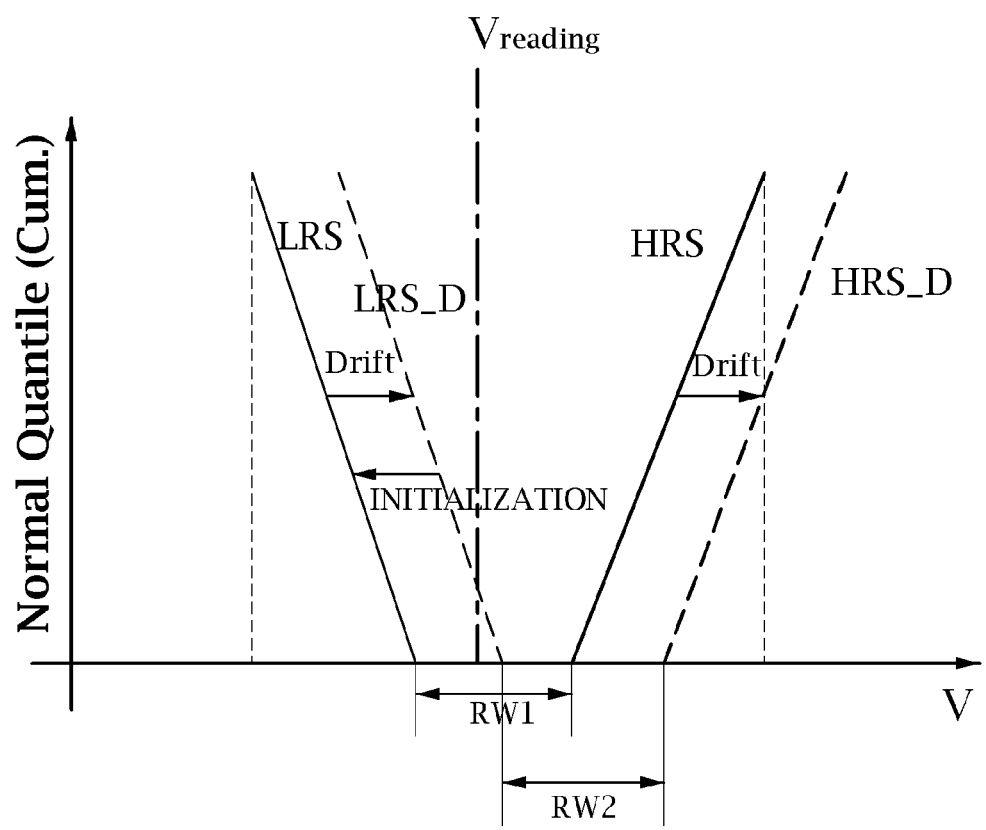

[FIG.13]
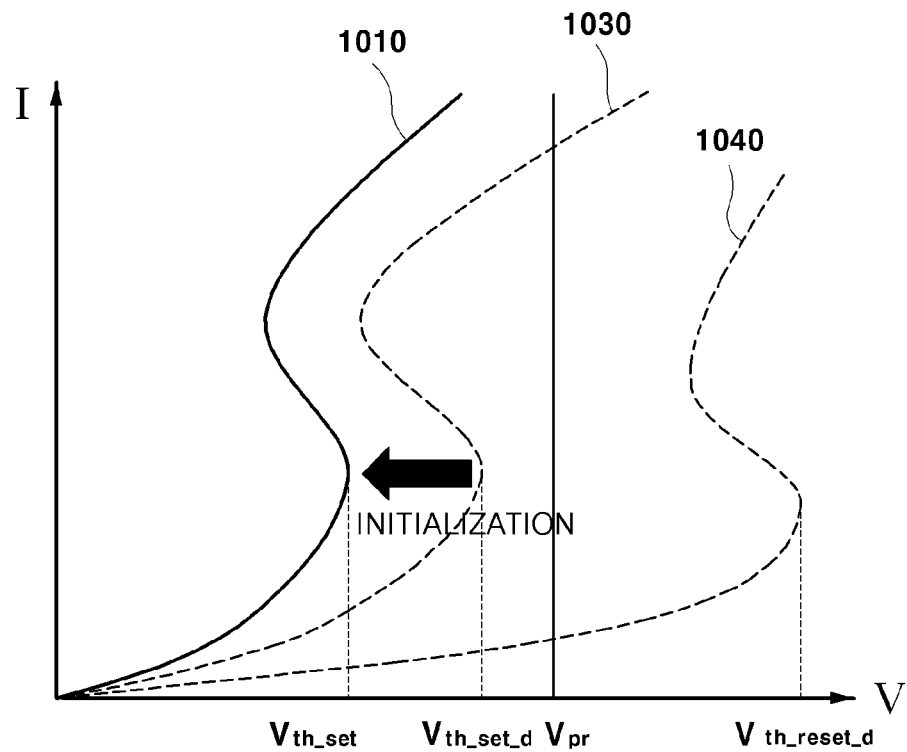
[FIG.14]
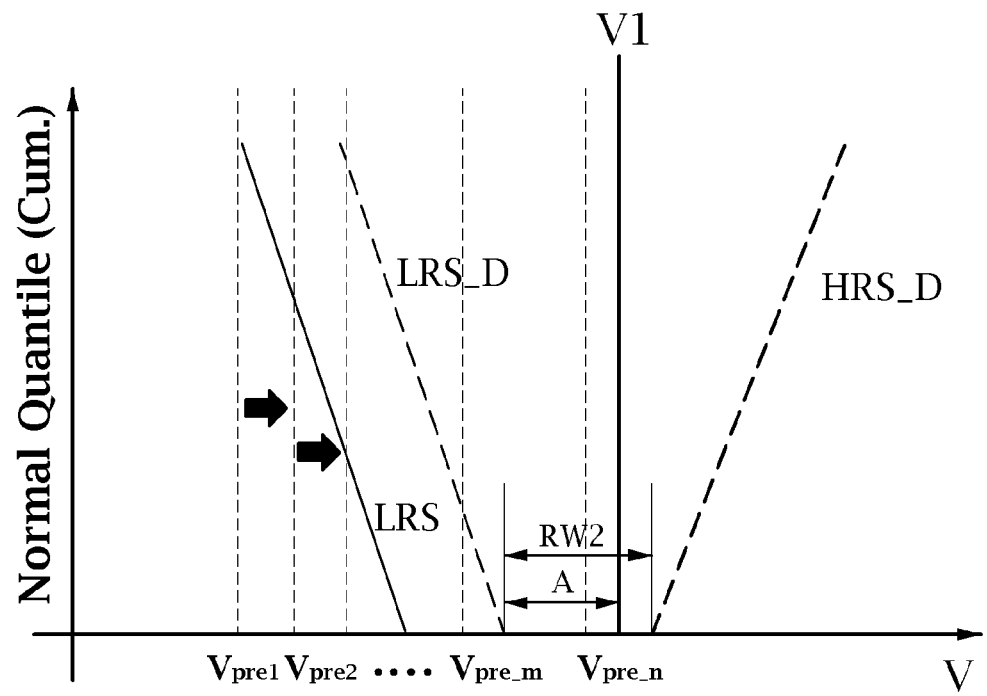

COMPOSITION FOR MEMORY CELL CONTAINING CHALCOGEN COMPOUND, STRUCTURE THEREOF, METHOD FOR MANUFACTURING SAME, AND METHOD FOR OPERATING SAME

TECHNICAL FIELD

The present invention provides a material composition for improving the stable operation and characteristics of a memory cell including a two-terminal selector element which performs the function of selecting a memory cell in a memory array or a selective memory element in which one element simultaneously performs the function of storing a logic state and the function of selecting a memory cell, the structure of the memory cell, and an algorithm for improving drift.

BACKGROUND ART

Due to the recent explosive growth of the data server market and the need to develop new AI semiconductors, the importance of non-volatile memories is increasing.

Among various non-volatile memories, a phase-change random access memory (PRAM) is a non-volatile memory which utilizes the characteristics of a chalcogen compound whose phase is changed going back and forth between an amorphous state and a crystalline state according to heat applied. Recently, a memory with a cross-point structure has been developed and commercialized in which a memory array is formed by disposing and connecting memory cells, which include a chalcogen compound whose phase is changed and a two-terminal switching selector exhibiting a sharp increase in current flow when an applied voltage is equal to or greater than a predetermined voltage, at intersections of electrodes disposed in horizontal and vertical directions.

The two-terminal switching selector is required for a memory device with a cross-point structure, and through the two-terminal switching selector, a memory cell required for reading and writing may be selected among many memory cells. Many two-terminal switching selectors are chalcogen compounds.

Meanwhile, in order to form a cross-point structure as described above, a phase-change material for storing a logic state and a two-terminal switching selector for selecting a memory cell are connected to form a memory cell, and the recent U.S. patent Ser. No. 10/134,470 describes a memory device with a cross-point structure which utilizes a memory cell including a single chalcogen compound layer which simultaneously serves as a two-terminal switching selector and a memory by using a chalcogen compound instead of a phase-change material, and an operation method of the memory device.

In order to manufacture a memory array with a cross-point structure through a memory cell including a selective memory element in which a logic state storage role and a selector role are simultaneously performed in a single chalcogen compound layer, it is necessary to form electrode lines (bit lines, word lines) intersecting each other and a pillar including a selective memory element, which is a chalcogen compound, at intersections of the electrode lines, but when considering the low rigidity of the chalcogen compound, there are many difficulties in a process for forming the pillar including the chalcogen compound. Accordingly, there is a need for a structure of a selective memory element and a suitable process therefor in order to manufacture a memory device with a cross-point structure using the selective memory element, which a chalcogen compound, more efficiently and at a lower cost.

Meanwhile, like a memory cell 1S1P including a two-terminal selector and a phase-change memory element, a memory cell 1S including a selective memory element represents logic states divided into a set state, which is a low resistance state, and a reset state, which is a high resistance state.

The change in current according to voltage in the memory cell 1S or 1S1P is shown in FIG. 1, wherein a memory cell in the set state flows only a low current as the current is applied, but shows a sharp increase in current at a threshold voltage $V_{th\_set}$ or greater, which is expressed as being turned-on. A memory cell in the reset state is also turned on at a threshold voltage $V_{th\_reset}$ or greater and shows a sharp increase in current.

In order to determine such a logic state of a memory cell, as shown in FIG. 1, a reading voltage $V_{reading}$ is applied in a reading window RW, which is the range between the threshold voltage $V_{th\_set}$ in the set state and the threshold voltage $V_{th\_reset}$ in the reset state to measure a flowing current, thereby determining whether a selected memory cell is in the set state or the reset state.

However, as time elapses, a threshold voltage of the memory cell 1S1P including a two-terminal selector, which is composed of a chalcogen compound, and a phase-change memory element or the memory cell 1S including a selective memory element moves in a gradually increasing direction due to the characteristics of a material. Such a phenomenon is referred to as a drift phenomenon, which causes a reading window to change and thus a reading error is likely to occur. In order to solve such a drift problem, a composition of a chalcogen compound in which the drift phenomenon occurs relatively less, so that a reading window is stable is required, and on the other hand, a stable reading method for a memory cell in which drift has occurred is required.

DISCLOSURE OF THE INVENTION

Technical Problem

An object of the present invention is to provide a composition, a memory structure, a manufacturing method, and an operating method for stable operation and manufacturing of a memory cell including a selective memory element or a two-terminal selector, which is composed of a chalcogen compound.

Technical Solution

In order to achieve the object, a first aspect of the present invention may provide a composition for a selective memory element in which Ge is in the range of 5 to 20 at %, As is in the range of 10 to 30 at %, Se is in the range of 50 at % or greater, S is in the range of 0.5 at % or greater, and Si is in the range of greater than 0 to 1 at % or less in an atomic ratio.

In addition, a second aspect of the present invention may provide a memory array with a cross-point structure including a first electrode line and a second electrode line intersecting each other, and a selective memory element disposed at each intersection of the first electrode line and the second electrode line and being a chalcogen compound, wherein the memory array includes the first electrode line formed on a substrate, a first functional electrode formed between the first electrode line and the selective memory element, and a second functional electrode formed between the second electrode line and the selective memory element, wherein the first functional electrode is formed as a line along the first electrode line.

In a method for manufacturing a memory array with a cross-point structure having the structure proposed in the second aspect, a third aspect of the present invention may provide the manufacturing method including (a) depositing a first electrode layer on a substrate, (b) depositing a first functional electrode layer on the first electrode layer, (c) etching the first electrode layer and the first functional electrode layer together to form a first electrode line and a first functional electrode line, (d) depositing a first ILD layer on a substrate on which the first electrode line and the first functional electrode line are formed, (e) a first planarization step of planarizing the first ILD layer to form a first surface in which at least a portion of an upper surface of the first functional electrode line is exposed between the planarized first ILD layers when viewed from an upper surface, (f) depositing a second inter-layer dielectric (ILD) layer on the first surface, (g) a hole forming step of forming a hole on the second ILD layer through etching, wherein the hole is formed on the first functional electrode line, and (h) depositing a chalcogen compound constituting the selective memory element on the second ILD layer on which the hole is formed to form a selective memory element in the hole.

In addition, in an initialization method of a memory cell including a two-terminal selector or a selective memory, which is a chalcogen compound, a fourth aspect of the present invention may provide the initialization method of a memory cell including (a) applying an initialization voltage to the memory cell, (b) determining whether the memory cell is turned-on, and (c) when the memory cell is turned-on, terminating the initialization, and when the memory cell is not turned-on, increasing the initialization voltage and repeating the (a) and (b) steps, wherein when the increased initialization voltage exceeds a first voltage, terminating the initialization, wherein a first initialization voltage applied first from the initialization voltage is less than or equal to a maximum threshold voltage of a memory cell in a set state before drift, and the first voltage is within a drift reading window range, which is the voltage range between a minimum threshold voltage of the memory cell in a reset state expected after the drift and the maximum threshold voltage of the memory cell in the set state.

Advantageous Effects

As it becomes possible to stably operate a memory element including a chalcogen compound according to the present invention, the applicability of the memory element to various fields can be increased. In addition, since operational errors in the memory element including a chalcogen compound can be reduced, the accuracy of an electrical device including the memory element can be increased.

BRIEF DESCRIPTION OF THE DRAWINGS

FIG. 1 is a graph showing a change in current according to voltage in a memory cell including a selective memory element or a two-terminal selector.

FIG. 2 is a graph showing a change in current according to voltage in a memory cell including a selective memory element or a two-terminal selector.

FIG. 3 is a graph schematically showing the correlation between the coordination number and drift of a chalcogen compound.

FIG. 4 is a diagram showing a structure of a memory cell including a selective memory element according to the typical art.

FIG. 5 is a diagram showing a structure of a memory cell including a selective memory element according to an embodiment of the present invention.

FIG. 6 is a diagram showing a structure of a memory cell including a selective memory element according to another embodiment of the present invention.

FIG. 7 is a diagram showing the comparison between the structure of a memory cell including a selective memory element according to the typical art and the structure of a memory cell including a selective memory element according to the present invention.

FIG. 8 is a process diagram describing a method for manufacturing a memory cell including a selective memory element according to the typical art.

FIG. 9 is a process diagram describing a method for manufacturing a memory cell including a selective memory element according to the present invention.

FIG. 10 is a process diagram describing a method for manufacturing a memory cell including a selective memory element according to an embodiment of the present invention.

FIG. 11 is a process diagram describing a method for manufacturing a memory cell including a selective memory element according to another embodiment of the present invention.

FIG. 12 is a graph showing a threshold voltage distribution of a memory cell including a selective memory element or a two-terminal selector.

FIG. 13 is a graph showing threshold voltage initialization of a memory cell including a selective memory element or a two-terminal selector.

FIG. 14 is a graph showing initialization steps of a memory cell including a selective memory element or a two-terminal selector.

BEST MODE FOR CARRYING OUT THE INVENTION

Hereinafter, the configurations and operations of embodiments of the present invention will be described with reference to the accompanying drawings. In the following description of the present invention, when it is determined that detailed descriptions of related known functions or configurations may unnecessarily obscure the gist of the present invention, the detailed descriptions will be omitted. In addition, when a portion is said to 'include' any component, it means that the portion may further include other components rather than excluding the other components unless otherwise stated.

According to the present invention, a composition for a selective memory element may be provided in which Ge is in the range of 5 to 20 at %, As is in the range of 10 to 30 at %, Se is in the range of 50 at % or greater, S is in the range of 0.5 at % or greater, and Si is in the range of greater than 0 to 1 at % or less in an atomic ratio.

When a memory cell reads a logic state in a memory array with a cross-point structure including a selective memory element, as the difference between a threshold voltage of a memory cell in a set state and a threshold voltage of a memory cell in a reset state, i.e., a reading window, is stable, the probability of an error in determination is reduced.

However, due to its characteristics, a chalcogen compound used in a selective memory element has a problem in that a drift phenomenon is exhibited in which a threshold voltage of a memory cell in a set state and a threshold voltage thereof in a reset state both increase over time, so that a reading window is changed.

Therefore, after a predetermined period of time, the threshold voltage in FIG. 1 is changed to a threshold voltage $V_{th\_set\_d}$ in a set state and a threshold voltage $V_{th\_reset\_d}$ in a reset state as shown in FIG. 2, and a reading voltage $V_{reading}$ set according to an initial reading window RW may be positioned outside a reading window $RW_D$ after drift, so that the probability of an error in a reading step increases.

Such a drift phenomenon may be controlled according to the composition of a chalcogen compound, and FIG. 3 shows 1/drift (reciprocal of threshold voltage variation according to drift) (y-axis) of a selective memory element according to a mean coordination number (x-axis) of a chalcogen element. As shown in FIG. 3, the smaller the mean coordination number of a chalcogen element on the periodic table, the larger the 1/drift value. That is, the drift is reduced and a reading window appears large. Particularly, the smaller the atomic number of a chalcogen element, the greater the effect, so that in consideration of the above, it is preferable to use a chalcogen compound including Se and S. Particularly, when Se and S are mixed and used, there is an advantage in that both the performance and the manufacturing suitability for manufacturing a selective memory may be satisfied. Therefore, it is preferable that a chalcogen compound in which Se is 50 at % or greater and S is 0.5 at % or greater is a chalcogen element. Particularly, it is more preferable that the content of S is 1 to 2 at %.

In addition, the chalcogen compound for a selective memory may further include a reduced amount of a Group 4 or Group 5 element, and such Group 4 and Group 5 elements are representatively Ge and As, respectively, wherein Ge may be included in 5 to 20 at % and As may be included in 10 to 30 at %.

Meanwhile, when S is included, the rigidity of a selective memory element is reduced, so that there may be difficulties in a manufacturing process of manufacturing a memory cell including the selective memory element. Therefore, In order to complement such rigidity, Si may be included in 1 at % or less.

In addition, a Group 3 element in a trace amount may improve drift, wherein In is effective, representatively. In addition to In, B, Al, Ga, and Tl may be effective. It is preferable that a Group 3 element is included in 0 to 15 at %.

Composition examples of such a chalcogen compound are shown in the table below.

TABLE 1

| No. | In (at %) | Ge (at %) | As (at %) | Se (at %) | S (at %) | Si (at %) |
|---|---|---|---|---|---|---|
| 1 | 0.1 | 10.0 | 27.0 | 52.0 | 10.4 | 0.5 |
| 2 | 0.5 | 20.0 | 15.5 | 55.0 | 8.5 | 0.5 |
| 3 | 4.0 | 15.5 | 15.0 | 60.0 | 5.0 | 0.5 |
| 4 | 10.0 | 18.0 | 15.0 | 55.0 | 1.0 | 1.0 |
| 5 | 15.0 | 10.0 | 10.0 | 63.5 | 0.7 | 0.8 |

When the content of a chalcogen element increases, the mean coordination number decreases, so that the characteristics of a selective memory are improved. On the contrary, the rigidity of a material is reduced, which may make it difficult to form a pattern, and may cause cleaning damage. Although there is generally a slight difference depending on a material, when Se or S is used rather than Te, a drift value becomes smaller, but rigidity is further reduced. To overcome the above, Si is included in the composition, but there is still a need to complement this.

In order to overcome the problem, the present invention proposes a structure for a selective memory cell including a selective memory element which is a chalcogen compound, and a manufacturing method of the selective memory cell.

The present invention may provide a memory array with a cross-point structure including a first electrode line and a second electrode line intersecting each other, and a selective memory element disposed at each intersection of the first electrode line and the second electrode line and being a chalcogen compound, wherein the memory array with a cross-point structure includes the first electrode line formed on a substrate, a first functional electrode formed between the first electrode line and the selective memory element, and a second functional electrode formed between the second electrode line and the selective memory element, wherein the first functional electrode is formed as a line along the first electrode line.

In general, a memory array with a cross-point structure using a selective memory element, which is a chalcogen compound, is made by forming a pillar 41 in which a first functional electrode 21-a selective memory element 30-a second functional electrode 22 are sequentially stacked between intersecting electrode lines 11 and 12 as shown in FIG. 4.

However, as a pillar including functional electrodes is formed as described above, the height of the pillar is increased, so that the aspect ratio (height/width) of the pillar is increased. When the aspect ratio of a pillar is increased as described above, a pillar including a chalcogen compound with poor rigidity is damaged during a process or has reduced accuracy, and there is a great risk of damage during a cleaning operation. Therefore, it is necessary to reduce the overall height of the pillar to reduce the aspect ratio.

In addition, rather than forming a pillar by forming a layer of a chalcogen compound with poor rigidity and then etching the layer, it is preferable to manufacture a pillar through a damascene process of filling a formed groove, for which it is advantageous that a functional electrode is not included in the pillar in a process.

Therefore, as shown in FIG. 5, the present invention provides a structure in which a first functional electrode line 23 is formed as a line along a first electrode line 11 which is first formed on a substrate and the selective memory element 30 is formed as a pillar thereon, and then a second functional electrode line 24 is again formed as a line along a second electrode line 12.

In the structure thus formed, the height of a pillar including a selective memory element, which is a chalcogen compound with poor rigidity, is lowered, thereby reducing the aspect ratio of the pillar including the chalcogen compound, so that it is possible to prevent process failure, or prevent accuracy from being reduced. In addition, since a layer forming the pillar is composed of a single layer of the chalcogen compound constituting the selective memory element, it is also suitable for applying the damascene process.

In addition, typically, as shown in FIG. 7(a), a first function electrode 21 is formed in a pillar shape, so that there is a high possibility that there may be leakage of a current due to a failure in which the first functional electrode crosses over an insulator, but in the present invention, as shown in FIG. 7(b), the possibility of a first functional electrode 23 crossing over an insulator is fundamentally blocked, so that there will be no possibility of current leakage due to a functional electrode.

In addition, in the present invention, as shown in FIG. 6, it may be a structure in which the first functional electrode line 23 is formed along the first electrode line 11 and the selective memory element 30 is formed as a pillar thereon, and then a second electrode 22 is formed as a pillar following the selective memory element 30 and the second electrode line 12 is formed.

In this case, since it is also possible to form a pillar 42 composed of the selective memory element 30 and the second functional electrode 22 through the damascene process, process failure and the like may be prevented, and there will be no possibility of current leakage as shown in FIG. 7(a).

The first functional electrode and the second functional electrode according to the present invention are positioned between the first electrode and the second electrode intersecting each other and the selective memory element, and such functional electrodes should serve to improve characteristics of the selective memory while having characteristics of a conductive material (including a material having conductivity only under certain conditions), and at the same time, have the function of serving as a diffusion barrier of elements between the two electrodes and the selective memory element, preferably.

Therefore, the functional electrodes may be composed of carbon, an oxide, a nitride, a silicon oxide, a boride, or a combination thereof.

The carbon may be an amorphous carbon or graphene, the oxide may be various metal oxides such as $TiO_x$, $TaO_x$, $HfO_x$, $ZrO_x$, $AlO_x$, $ZnO_x$, $SiO_x$, $RuO_x$, $PtO_x$, and the like, the silicon oxide may be a silicon oxide further including Si in the above-described metal oxides, the nitride may be TiN, TaN, or CN, and the boride may be CB, TiB, TaB, or the like.

Particularly, the first functional electrode and the second functional electrode according to the present invention may be an amorphous carbon, and the thickness may be in the range of 50 to 300 Å.

The amorphous carbon is suitable for serving as a diffusion barrier between a metal line and a selective memory element and has excellent conductivity, and thus, is preferable as a material for a functional electrode. If the thickness is too thin, it is insufficient to serve as a diffusion barrier, and if it is too thick, electrical resistance between a selective memory element and an electrode increases, which is not preferable. Therefore, a suitable thickness is in the range of 50 to 300 Å, and more preferably in the range of 100 to 200 Å.

In addition, the first functional electrode and the second functional electrode according to the present invention may be an oxide, a nitride, a silicon oxide, a boride, or a combination thereof, and the thickness may be in the range of 3 to 300 Å.

An oxide, a nitride, a silicon oxide, and a boride are non-conductive materials which are suitable for a diffusion barrier, but if too thick, there is a problem in that resistance increases. Therefore, a suitable thickness is in the range of 3 to 30 Å, and more preferably in the range of 5 to 10 Å.

In addition, the present invention may provide a memory array with a cross-point structure including a selective memory element in which the first functional electrode or the second functional electrode is composed of two layers, wherein a first layer of the two layers is in contact with the selective memory element and a second layer thereof is in contact with a first electrode or a second electrode, and the first layer is composed of an oxide, a silicon oxide, a nitride, a boride, or a combination thereof and has a thickness in the range of 3 to 20 Å, and the second layer is an amorphous carbon and has a thickness in the range of 50 to 300 Å.

The first layer of the functional electrode is made of a ceramic material such as an oxide which may more faithfully act as a diffusion barrier by being in contact with the selective memory device, and the second layer in contact with the electrode is formed of an amorphous carbon, so that resistance may be reduced. At this time, the thickness of the first layer is in the range of 3 to 20 Å, and more preferably in the range of 5 to 10 Å, and the thickness of the second layer is in the range of 50 to 300 Å, and more preferably in the range of 100 to 200 Å.

By forming the functional electrode in a plurality of layers instead of a single layer as described above, the advantage of each material may be combined.

In addition, in the memory array with a cross-point structure including the selective memory element as described above, a composition of the selective memory element may be a chalcogen compound in which Ge is 5 to 25 at %, As is 10 to 30 at %, Se is 50 at % or greater, S is 0.5 at % or greater, and Si is greater than 0 to 1 at % or less in an atomic ratio.

In addition, the selective memory element may be a chalcogen compound further including at least one element from the group consisting of B, Al, In, Ga, and Tl in the range of greater than 0 to 15 at % or less in an atomic ratio.

Hereinafter, a method for manufacturing a memory array of a composition having the composition and the structure as described above will be described.

According to the present invention, there may be provided a method for manufacturing a memory array with a cross-point structure including a selective memory element, the method including (a) depositing a first electrode layer on a substrate, (b) depositing a first functional electrode layer on the first electrode layer, (c) etching the first electrode layer and the first functional electrode layer together to form a first electrode line and a first functional electrode line, (d) depositing a first ILD layer on a substrate on which the first electrode line and the first functional electrode line are formed, (e) a first planarization step of planarizing the first ILD layer to form a first surface in which at least a portion of an upper surface of the first functional electrode line is exposed between the planarized first ILD layers when viewed from an upper surface, (f) depositing a second inter-layer dielectric (ILD) layer on the first surface, (g) a hole forming step of forming a hole on the second ILD layer through etching, wherein the hole is formed on the first functional electrode line, and (h) depositing a chalcogen compound constituting the selective memory element on the second ILD layer on which the hole is formed to form a selective memory element in the hole.

Here, the first ILD layer may be an oxide, and the second ILD layer may be a nitride. The first ILD layer may be formed of a general insulating material such as a silicon oxide or an aluminum oxide, whereas the second ILD layer having a large contact area with the selective memory device, which is a chalcogen compound, may be formed of a nitride which is stable, thereby having low reactivity, for example, TiN, TaN, or CN to reduce the possibility of reaction with the selective memory element.

In addition, there may be provided a method for manufacturing a memory array with a cross-point structure including a selective memory element, the method further including, after the (h) step, (i) a second planarization step of planarizing the deposited chalcogen compound layer to the same height as that of the second ILD layer to form a second surface in which the selective memory elements are exposed independently of each other between the second ILD layers when viewed from an upper surface, (j) depositing a second functional electrode layer on the second surface, (k) depositing a second electrode layer on the second functional electrode layer, and (l) etching the second functional electrode layer and the second electrode layer together to form a second functional electrode line and a second electrode line.

As another method, there may be provided a method for manufacturing a memory array with a cross-point structure including a selective memory element, the method further including, after the (h) step, (m) a third planarization step of planarizing the deposited chalcogen compound layer to a height lower than that of the second ILD layer to allow the chalcogen compound layer to be removed from a surface other than the hole, and to form a third surface in which the selective memory elements are exposed independently of each other between the second ILD layers when viewed from an upper surface, and the height of the selective memory element is lower than that of the second ILD layer when viewed from a side cross-section, (n) depositing a second functional electrode layer on the third surface, (o) a fourth planarization step of planarizing the second functional electrode layer to the same height as that of the second ILD layer to allow the second functional electrode layer to be removed from a surface other than the hole, and to form a fourth surface in which the second functional electrodes are exposed independently of each other in the second ILD layer, (p) depositing a second electrode layer on the fourth functional electrode layer, and (q) etching the second electrode layer to form a second electrode line.

An example of a typical general method for manufacturing a memory array with a cross-point structure is shown in FIG. 8. In the typical method, a first electrode layer 111, a first functional electrode layer 211, a chalcogen layer 311 constituting a selective memory element, and a second first electrode layer 221 are sequentially deposited and formed (Step 1), and all of them are simultaneously etched to form a wall 412 composed of a first functional electrode line 212, a chalcogen line 312, and a second functional electrode line 222, and a first electrode line 112 (Step 2) A first ILD layer 611 is stacked thereon (Step 3) and planarized to form a first planarization surface 611a exposing an upper surface 222a of a second functional electrode line 222 (Step 4). Thereafter, a second electrode layer 121 is deposited (Step 5) and etched to form a second electrode line 122, and at this time, etching is performed along the second electrode line 122 to a first functional electrode 213 to form a pillar 413 composed of a first functional electrode 213-a selective memory element 313-a second functional electrode 223 (Step 6). Thereafter, a second ILD layer 621 is deposited thereon to allow the second ILD layer to be filled between pillars (Step 7).

In the process as described above, while undergoing two times of etching in Step 2 and Step 6, the chalcogen layer 311 is prone to damage and forms the high wall 412 and the pillar 413 which are not supported by the surrounding, and due to characteristics of a chalcogen compound with poor rigidity, the wall 412 and the pillar 416 having such a high aspect ratio may be damaged during the process or have reduced accuracy.

In order to overcome the problem, the present invention proposes a method for manufacturing a memory array with a cross-point structure using the damascene process.

When the manufacturing method according to the present invention is described in more detail through to FIG. 9, a first electrode layer 131 is deposited on a substrate and a first functional electrode layer 231 is again deposited thereon, and then the first electrode line 131 and the first functional electrode layer 231 are etched together to form a first electrode line 132 and a first functional electrode line 232. On the first electrode line 132 and the first functional electrode line 232 thus formed, a first ILD layer 631 is deposited, and a first planarization step is performed in which the first ILD layer 631 is planarized to form a first surface 632a in which an upper surface 232a of the first functional electrode line 232 is exposed between planarized first ILD layers 632 when viewed from an upper surface. On the first surface 632a thus formed, a second ILD layer 641 is deposited. A hole 711 is formed on the second ILD layer 641 through etching, and the hole 711 is formed on the upper surface 232a of the first functional electrode line 232. On the second ILD layer 641 including the hole 711 thus formed, a chalcogen compound layer 321 constituting a selective memory element is deposited to fill the chalcogen compound into the hole, thereby forming a selective memory element 322.

By forming the selective memory element 322 in the hole as described above, it is possible to stably form a pillar in the second ILD layer 641 despite poor rigidity of the chalcogen compound.

Thereafter, it is possible to form a second functional electrode and a second electrode line by two methods.

First, a method for forming a second functional electrode as a line along a second electrode line is described with reference to FIG. 10. The chalcogen compound layer 321 deposited in FIG. 9 is planarized to the same height as that of the second ILD layer 641 to form a second surface 641a in which upper surfaces 322a of the selective memory element 322 are exposed independently of each other between the second ILD layers when viewed from an upper surface. Thereafter, on the second surface 641a, a second functional electrode layer 241 is deposited. Through a step of depositing again a second electrode layer 141 on the second functional electrode layer 241, and etching the second functional electrode layer 241 and the second electrode layer 141 together to form a second functional electrode line 242 and a second electrode line 142, a cross-point structure is finally formed.

A memory array of the cross-point structure thus formed has a shape as shown in FIG. 5 in which the first functional electrode line 232 and the second functional electrode line 242 are respectively formed as a line along the first electrode line 132 and the second electrode line 142, and the selective memory element 322 is formed in a pillar shape at a point at which the first functional electrode line 232 and the second functional electrode line 242 intersect.

Another method relates to a structure in which a second functional electrode forms a pillar together with a selective memory element, which will be described through FIG. 11.

The chalcogen compound layer 311 deposited in FIG. 11 is planarized to a height lower than that of the second ILD layer 641. The planarization operation is referred to as an etch-back operation, and through the etch-back, the chalcogen compound layer 321 is removed from a surface other than the hole 712, and an upper surface 322b of the selective memory element 322 is independently exposed when viewed from an upper surface, wherein the height of the upper surface 322b is lower than that of the second ILD layer 641 to form a third surface 641b in which the hole 712 is still maintained on the selective memory element 322. A second functional electrode layer 251 is again deposited on the third surface 641b to form a second functional electrode 252 into the hole 712. Thereafter, a second electrode layer 151 is deposited, and then etched to for a second electrode line 152 for finishing.

A memory array of the cross-point structure thus formed has a shape as shown in FIG. 6 in which the first functional electrode line 232 is formed as a line along the first electrode line 132, and the second functional electrode 252 is extended over the selective memory element 322 to form a pillar 420.

Through the damascene process of filling the chalcogen compound into the hole, a process is prevented in which the selective memory element, which is a chalcogen compound, stands or is etched without a support layer on the side, thereby preventing damage to the selective memory device and preventing failure.

Meanwhile, a threshold voltage of the memory cell 1S1P including a two-terminal selector and a phase-change memory element or the memory cell 1S including a selective memory element moves in a gradually increasing direction due to the characteristics of a material. A distribution LRS of threshold voltages of memory cells in a set state and a distribution HRS of threshold voltages of memory cells in a reset state are indicated by solid lines, and it is shown that such distributions of threshold voltages LRS and HRS increase over time according to a drift phenomenon and are changed to distributions LRS_D and HRS_D of threshold voltages of dotted lines.

When threshold voltages are changed as described above, a reading window in which the reading voltage $V_{reading}$ may be located in order to effectively read logic states of memory cells is changed before RW1 and after RW2 the drift. This change is particularly problematic in that the threshold voltages of the memory cells in the set state gradually increase, and the memory cells in the set state may be erroneously read as being in the reset state as shown in FIG. 2.

In order to prevent such an error during an operation, it is necessary to return a memory cell in the set state which has undergone drift over time back to an initial state thereof before the drift.

To this end, in an initialization method of a memory cell including a two-terminal selector or a selective memory, which is a chalcogen compound, the present invention provides the initialization method of a memory cell including (a) applying an initialization voltage to the memory cell, (b) determining whether the memory cell is turned-on, and (c) when the memory cell is turned-on, terminating the initialization, and when the memory cell is not turned-on, increasing the initialization voltage and repeating the (a) and (b) steps, wherein when the increased initialization voltage exceeds a first voltage, terminating the initialization, wherein a first initialization voltage applied first from the initialization voltage is less than or equal to a maximum threshold voltage of a memory cell in a set state before drift, and the first voltage is within a drift reading window range, which is the voltage range between a minimum threshold voltage of the memory cell in a reset state expected after the drift and the maximum threshold voltage of the memory cell in the set state expected after the drift.

The above-described method is an initialization method of returning a threshold voltage of a memory cell in a set state back to a state before drift before a reading step of determining whether the memory cell is in the set state or in a reset state.

The threshold voltage of the memory cell 1S1P including a two-terminal selector and a phase-change memory element or the memory cell 1S including a selective memory element returns to a threshold voltage of the memory cell in an initial set state after the memory cell is turned on beyond the threshold voltage regardless of whether the memory cell is in the set state or the reset state. FIG. 13 shows such initialization, wherein the threshold voltage $V_{th\_set\_d}$ in a voltage-current curve 1030 of a memory cell in a set state after drift has occurred is initialized to the threshold voltage $V_{th\_set}$ in a voltage-current curve 1010 of a memory cell in a set state before the drift after an initialization voltage $V_{pr}$ is applied and turn-on is achieved.

Therefore, when all memory cells in the set state are turned on and initialized before the memory cells are read, reading errors caused by changes in the reading window due to drift may be reduced. The above-described initialization method is required to stably maintain the reading window of a cell in which drift has occurred.

With reference to FIG. 14, the initialization method according to the present invention will be described in more detail.

First, a first initialization voltage $V_{pre1}$ is applied to a memory cell in which drift has occurred and whether the memory cell is turned-on is determined.

When the memory cell is turned-on, initialization is stopped, and when the memory cell is not turned-on, an initialization voltage is increased and an initialization voltage $V_{pre2}$ is applied again, and whether the memory cell is turned-on is determined again.

Whether the memory cell is turned-on is determined while the initialization voltage is increased stepwise ($V_{pre1} \rightarrow V_{pre2} \rightarrow V_{pre3} \ldots V_{pre\_n}$), through which all memory cells in the set state are turned on and initialized.

If a memory cell is in the reset state, and thus, is not turned-on, the initialization process is terminated when an increased initialization voltage exceeds a first voltage V1, and the first voltage V1 is within the drift reading window range RW2, which is a voltage range between a minimum threshold voltage V41 of a memory cell in the reset state expected after the drift and a maximum threshold voltage V32 of the memory cell in the set state expected after the drift. Accordingly, since the initialization voltage is greater than the maximum threshold voltage V32 in the set state, all memory cells in the set state may be turned-on, and since it does not exceed the minimum threshold voltage V41 of the memory cell stably in the reset state, a memory cell in the reset state is prevented from being turned-on and the memory cell in the reset state is not initialized.

The initialization voltage for initializing a memory cell in the set state according to the initialization method of the present invention is only slightly higher than a threshold voltage of the memory cell, so that a load applied to the memory cell due to the initialization process may be very small. If the initialization is performed with a voltage which is too high, a memory cell is abruptly turned-on to allow a very large current to flow at once, so that the memory cell may be damaged.

At this time, the first initialization voltage $V_{pre1}$ to be applied first may be a minimum threshold voltage V11 of a memory cell in the set state before drift.

By gradually increasing an applied voltage from the minimum possible threshold voltage of a memory cell, it is possible to minimize the load applied to the memory cell due to the initialization process.

In addition, in the (c) step, the initialization voltage may be increased by 5 to 200 mV at a time.

If the initialization voltage is increased too much at once, a current flowing in a cell to be turned-on may be too large, and if increased too little, it is not preferable because the time required for the initialization process is increased.

Therefore, a preferred voltage increase is 5 to 200 mV at a time, more preferably 20 to 60 mV.

Meanwhile, a first voltage is in the range of a drift reading window, and the difference between the first voltage and a maximum threshold voltage of a memory cell in a set state expected after the drift may be in the range of 0.50 to 0.95 with respect to the drift reading window.

In FIG. 14, it is preferable that the first voltage V1 is within the drift reading window range RW2 and is close to the minimum threshold voltage 41 of the memory cell in the reset state expected after the drift in order to initialize all memory cells in a set state in which a threshold voltage is abnormally high, which may be possible.

To this end, it is preferable that a difference A between the first voltage V1 and the maximum threshold voltage V32 of the memory cell in the set state expected after the drift is in the range of 0.50 to 0.95 when the entire drift leading window RW2 is 1. When the first voltage V1 is close to the maximum threshold voltage V32 of the memory cell in the set state after the drift since the value is less than 0.50, it is not preferable since the memory cell in the set state having an abnormally large threshold voltage may not be initialized, and when positioned as close as possible, but too close to the minimum threshold voltage V41 of the memory cell in the reset state, it is also not preferable since the cell in the reset state may be initialized.

Therefore, it is preferable that the difference A between the first voltage V1 and the maximum threshold voltage V32 of the memory cell in the set state expected after the drift is in the range of 0.50 to 0.95 when divided by the entire drift reading window RW2, more preferably in the range of 0.75 to 0.90.

The invention claimed is:

1. A method of initializing a memory cell including a two-terminal selector or a selective memory, which is a chalcogen compound, the method comprising:
   (a) applying an initialization voltage to the memory cell;
   (b) determining whether the memory cell is turned-on;
   (c) when the memory cell is not turned-on:
      (i) increasing the initialization voltage;
      (ii) determining whether the increased initialization voltage exceeds a first voltage;
      (iii) when the increased initialization voltage does not exceed the first voltage, repeating steps (a), (b), and (c) with the increased initialization voltage;
   (d) terminating the initializing of the memory cell when either:
      (i) the memory cell is determined to be turned-on in step (b), or
      (ii) the increased initialization voltage is determined to exceed the first voltage in step (c) (ii);
   wherein the initialization voltage applied in the first iteration of step (a) is less than or equal to a maximum threshold voltage of a memory cell in a set state before drift, and
   the first voltage is within a drift reading window range, which is the voltage range between a minimum threshold voltage of the memory cell in a reset state expected after the drift and the maximum threshold voltage of the memory cell in the set state expected after the drift.

2. The method of claim 1, wherein the initialization voltage applied in the first iteration of step (a) is a minimum threshold voltage of the memory cell in the set state before the drift.

3. The method of claim 1, wherein in the step (c) (i), the initialization voltage is increased by 5 mV to 200 mV at a time.

4. The method of claim 1, wherein a ratio of a voltage difference between the first voltage and a maximum threshold voltage of the memory cell in the set state expected after the drift is in the range of 0.50 to 0.95 with respect to the drift reading window range.

* * * * *